SURFACE PASSIVATION

Filed Nov. 13, 1969 3 Sheets-Sheet 1

INVENTORS:
BILLY H. BREAZEALE
HERBERT KRAUS

INVENTORS:
BILLY H. BREAZEALE
HERBERT KRAUS

March 26, 1974 H. KRAUS ET AL 3,799,803

SURFACE PASSIVATION

Filed Nov. 13, 1969 3 Sheets-Sheet 3

INVENTORS:
*BILLY H. BREAZEALE*
*HERBERT KRAUS*

United States Patent Office 3,799,803

Patented Mar. 26, 1974

3,799,803

SURFACE PASSIVATION

Herbert Kraus, Richardson, and Billy H. Breazeale, Dallas, Tex., assignors to Texas Instruments Incorporated, Dallas, Tex.

Filed Nov. 13, 1969, Ser. No. 876,458
Int. Cl. B44d *1/20;* C23b *5/62*
U.S. Cl. 117—212 15 Claims

ABSTRACT OF THE DISCLOSURE

Passivation of a semiconductor surface polished with a solution of a methyl alcohol:bromine is completed by treating the polished surface with a hydrogen peroxide solution after rinsing with a solution of alcohol and water. Next, a deionized water rinse removes contaminants from the hydrogen peroxide treated surface. Finally, the passivated surface is dried in an atmosphere of pure nitrogen gas.

This invention relates to surface passivation and more particularly to surface passivation by means of a hydrogen peroxide rinse.

In the fabrication of Mercury-Cadmium-Tellurium (Hg,Cd)Te photodetectors, residues from the various processing steps contaminate the active surface. It has been found that these contaminants adversely affect the effective photo carrier lifetime and stability of the detector. A number of processing steps in the fabrication of a photodetector are known to produce the residue contamination. For example, the step of etch polishing the Mercury-Cadmium-Tellurium wafer with a halogen solution leaves a residue of the halogen.

Removal of the halogen without damage or additional contamination of the surface is difficult. It would be desirable to cause the halogen to desorb from the surface by heating the detector material in a vacuum; however, this causes decomposition of the (Hg,Cd)Te. Another technique that has been tried in an attempt to remove the halogen residue is that of etching. Etching the detector with various clean-up solutions, however, introduces additional contaminants. Furthermore, most presently available clean-up solutions are not compatible with evaporated contact materials (e.g., In Au, etc.) so that a clean-up treatment cannot be used just prior to application of a final protective coating.

An object of the present invention is to provide a process for removing contaminants from the surface of a photodetector wafer. Another object of this invention is to provide a process for removing contaminants from the surface of a photodetector wafer without introducing additional contamination. A still further object of this invention is to provide a process for removing contaminants from the surface of a photodetector wafer that does not interfere with further processing of the detector. Yet another object of this invention is to provide a process for removing bromine contaminants from the surface of a (Hg,Cd)Te photodetector.

Because it yields highly polished surfaces and excellent definition of detectors when photo masking procedures are used, an etch consisting of bromine and methyl alcohol is commonly used in the preparation of (Hg,Cd)Te photodetectors. Studies using radio active bromine have, however, shown that despite thorough rinsing procedures, high concentrations of bromine (greater than $10^{14}$ Br/cm.$^2$ of surface) remains on the surface of a (Hg,Cd)Te detector treated with a bromine:methyl alcohol etch. The properties of the (Hg,Cd)Te detectors are seriously degraded when not specially treated to remove the bromine.

In one process for producing photodetectors that will be substantially free of surface contamination, the surface is passivated by a rinse of a trichloroethylene solution after the sample has been etch polished. Surface passivation includes additional rinses of a methanol solution, a 30% solution of $H_2O_2$ and drying with a pure nitrogen gas. Additional contaminants are removed by bombarding with atomic hydrogen in a glow discharge process. After completing the glow discharge removal of contaminants, contact areas and active areas of the photodetectors are defined. Another hydrogen ion bombardment by means of a glow discharge removes additional contaminants. This last contaminant removal step is followed by coating with a protective film after which contacts are ball bonded to the contact areas.

A more complete understanding of the invention and its advantages will be apparent from the specification and claims and from the accompanying drawings illustrative of the invention.

Referring to the drawings.

Figure 1:
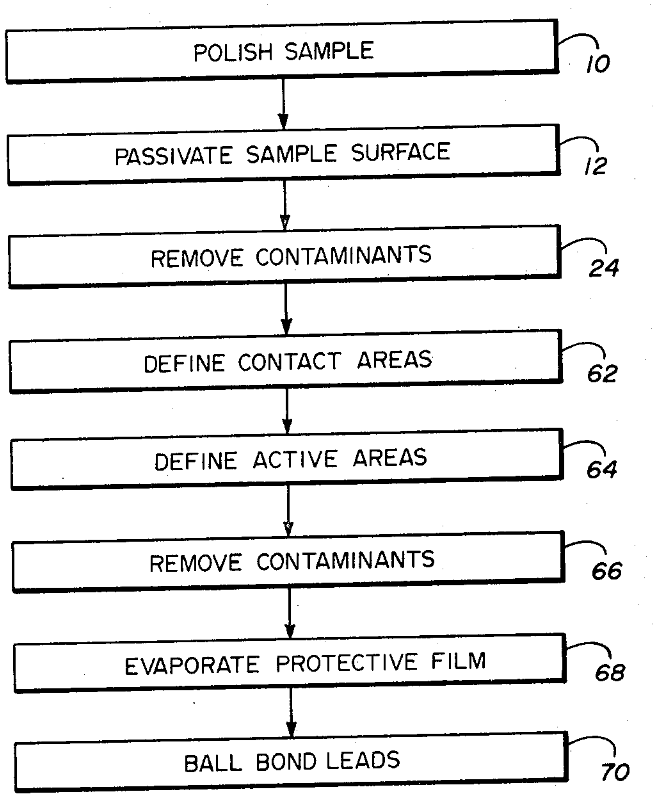
FIG. 1 is a flow chart of the process for fabricating an array of (Hg,Cd)Te photodedectors.

Referring to FIG. 1, initial preparation of a photodetector wafer prior to the polish step 10 includes cutting an ingot of (Hg,Cd)Te into slabs with a string saw. These slabs are then rinsed in boiling $CH_3OH$ to remove foreign matter, such as excess adhesive or excess cement. After the slabs have been dried, they are lightly ground on a glass plate with a 3200 grit lapping powder mixed with a detergent and distilled water. Continuing the preparation of a wafer prior to the polish step 10, the ground slabs are rinsed with distilled water and ultrasonically cleaned to remove the lapping powder mixture. The slabs are again washed in distilled water and briefly rinsed in hot $CH_3OH$ and dried. They are now ready for etch polishing with $CH_3OH$—Br.

The prepared wafer is now mounted on a flat Teflon surface for the polishing step 10. Using a methyl alcohol:bromine etch solution on a polishing pad, the sample is polished on one side to a damage-free, flat, mirror finish. Typically, the polishing step requires about 30 seconds. During the etch polish process, bromine from the etch solution will form the bromides of Hg, Cd and Te. Removal of the bromides of Hg, without damage or additional contamination of the surface, has proven to be difficult.

To remove the bromides of Hg, Cd and Te, a passivation step 12 is carried out on the polished wafer. The passivation step 12 includes rinsing the wafer with very dry alcohol followed by a water rinse to stop the etching action of the methanol:bromine solution. This rinse with very dry alcohol and water will effectively remove the bromides of Cd and Te, but not that of Hg. The relative insolubility of the bromides of mercury and particularly that of the reduced variety ($Hg_2Br_2$) is thought to be the main cause of the degradation of photodetectors with time.

Figure 2:
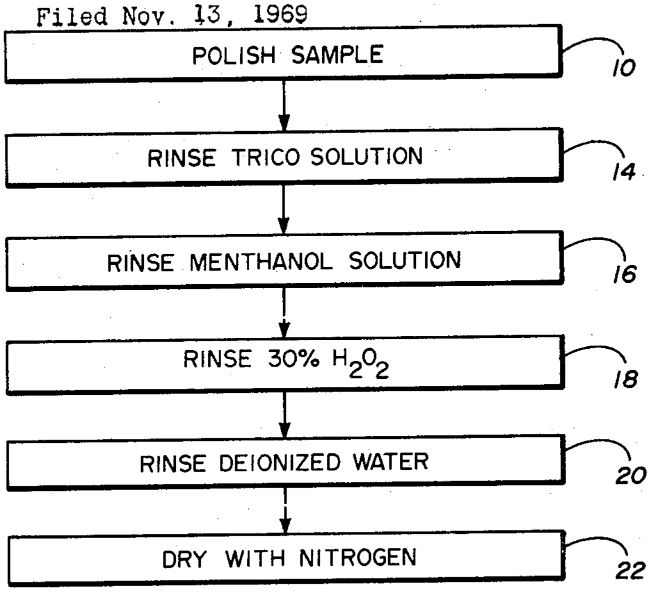
FIG. 2 is a flow chart of the steps of surface passivation in the process of FIG. 1.

Referring to FIG. 2, there is shown in detail the steps for removing the mercurous bromide or mercuric bromide from a wafer. After the polishing step 10, the wafer is rinsed with a boiling trichloroethylene solution, step 14, for a period of about 10 seconds.

Following the trichloroethylene rinse, the wafer is rinsed with a boiling methanol solution, step 16, again for a period of about 10 seconds. The methanol rinse is followed by an oxidation step which consists of a 30-second dip in 30% hydrogen peroxide heated to around 90° C. This step converts any mercurous bromide to the mercuric state rendering the undesired deposits soluble in water or methyl alcohol. After the hydrogen peroxide rinse, step 18, a deionized water rinse 20 dissolves and removes the mercuric bromide from the wafer; the deionized water rinse 20 comprising three separate rinsing cycles. Each rinse is for a period of from 5 to 10 seconds in deionized water heated to around 60° C. Immediately upon completion of the three deionized water rinses, the sample is dried in a pure nitrogen gas atmosphere, step 22.

Upon completion of the nitrogen drying step, the polishing and passivation of one side of the wafer is complete. Next, the wafer is mounted, polished side down, onto an optically polished sapphire substrate using an epoxy cement. After an overnight cure, the second side of the wafer is polished using the same process as the first side with the exception that all rinse temperatures are lowered to about 60° C. After polishing the second side of the wafer in step 10 and passivation of the wafer to remove the bromine contaminants in step 12, the next step in the process of fabricating an array of photodetectors, step 24, is to remove contaminants not previously removed.

Figure 3:
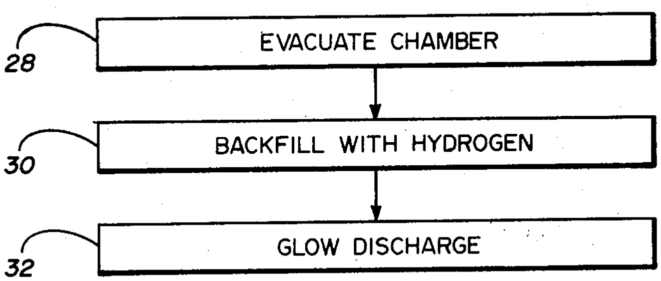
FIG. 3 is a flow chart of the steps of a glow discharge contaminant removal process.

Referring to FIG. 3, there is shown a flow diagram for a glow discharge contaminant removal process, step 24. The wafer is mounted in a suitable vacuum chamber, such as the bell jar 26 of FIG. 4. The first step 28 is to evacuate the bell jar 26 to a pressure on the order of 100 microns. After evacuating the chamber 26 to the desired pressure, it is backfilled, step 30, with hydrogen and a glow discharge, step 32, initiated. The atomic hydrogen created in the glow discharge reacts with the bromine and other surface contaminants to form volatile species which desorb from the surface leaving a contaminant-free surface. The volatile species are withdrawn from the chamber 26 in the vacuum manifold. Typically, a 10 minute glow discharge will remove most surface contaminants. After the specified time, the glow is extinguished and the bell jar 26 purged of the hydrogen gas.

Figure 4:
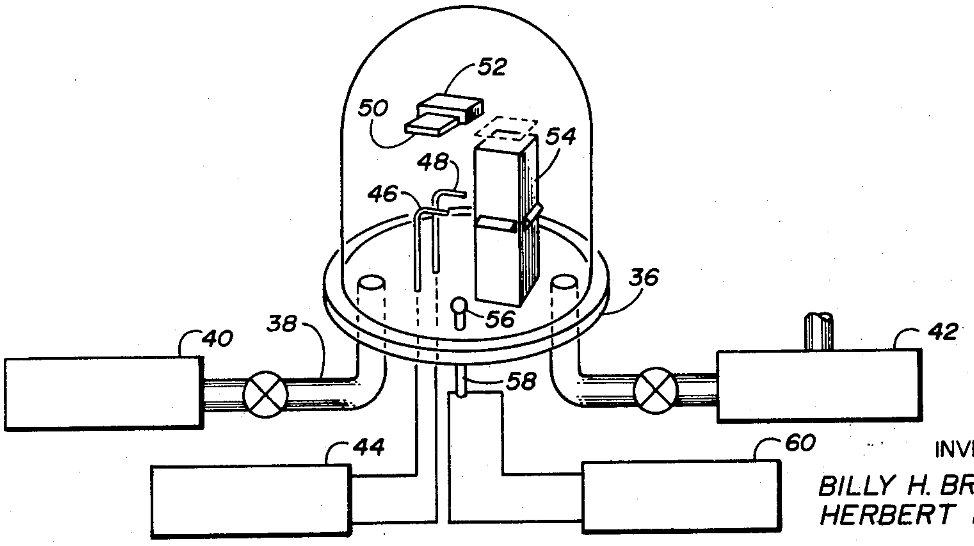
FIG. 4 illustrates a system for removing contaminants by means of a glow discharge.

Referring to FIG. 4, there is shown a system for operating the bell jar 26 to carry out the process of FIG. 3. The bell jar 26 is in a sealing engagement with a base 36 and may be evacuated through a pipe 38 by means of a vacuum system 40 of any suitable type, but should be capable of producing vacuums at least as low as 100 microns and includes traps and filters for maintaining the bell jar atmosphere within set limits of purity. The hydrogen for wafer cleaning may be introduced into the bell jar 26 through a manifold 42, as required. A variable A.C. or D.C. high voltage source 44 connects to a pair of electrodes 46 and 48 to establish the glow discharge within the bell jar 26. Although illustrated as rods, the electrodes may take the shape of a screen or any other appropriate shape. For the process of the present invention, the A.C. or D.C. voltage source should be capable of generating voltages at least as high as 5,000 volts. The wafer 50 which is to be cleaned in the bell jar 26 is mounted to a holder 52 which is supported by suitable means (not shown) from the base plate 36.

A thermocouple pressure gauge 56 is mounted within the bell jar 26 by means of a cable 58 passing through the base 36 for controlling the pressure within the bell jar. The cable 58 couples the gauge 56 to a control unit 60. The pressure gauge 56 includes a heat source and a temperature sensing element. Heating current is applied by way of a conductor 42 to a heater element within the gauge 56. The heat transfer to the thermocouple element of the gauge 56 depends upon the pressure inside the bell jar 26, thus applying a pressure-dependent signal to the control unit 60.

Upon completion of the contaminant removal step 24, contact areas are defined in a step 62. Physical masking, accomplished by placing a mask (usually a thin metal sheet with an etch pattern) in contact with the wafer, is often used in vacuum evaporation. The mask, however, must be placed very close to the substrate in order to minimize fuzzy diffused edges caused by the finite size of the source. A more widely used technique for defining the contact areas is by means of photoresist and etching. One of the most commonly used photoresist patterning techniques deposits a photoresist material on the substrate which is then exposed and developed in a conventional manner. Holes may thus be formed in the photoresist where it is desired to have contact metal on the wafer.

After defining the contact areas, the wafer is again returned to the bell jar 26 for evaporation of the contact material. For photodetectors of (Hg,Cd)Te, indium metal is preferred for the contact material.

Referring again to FIG. 4, the supporting means including the holder 52 is mounted such that the wafer 50 may be readily moved from the position illustrated to a position over a chimney 54 which is part of an evaporation and condensation system for evaporating the contact metal onto the defined areas. In the usual manner, the chimney 54 contains one or more vessels of a metal or metals to be evaporated onto the wafer 50 when in a position aligned with the opening of the chimney 54. The evaporated metal will propagate upwardly through the chimney and nucleate onto the surface of the wafer.

Upon completion of the evaporation of the contact metal, the wafer is again removed from the bell jar 26 and active areas defined by step 64. The active areas of the photodetector array may be formed by conventional photomasking and etching techniques as described earlier. At this time, both the active areas and the contacts are exposed to the atmosphere.

To remove additional contaminants that may have resulted from defining the contact and active areas, a glow discharge removal step 66 is carried out. The contaminant removal step 66 is identical to the step 62. The wafer 50 with the active and contact areas defined thereon is again mounted to the holder 52 and the bell jar 26 evacuated and backfilled with hydrogen through the manifold 42. The power source 44 initiates a glow discharge which causes atomic hydrogen to react with the bromine and other surface contaminants on the (Hg,Cd)Te wafer.

With the wafer still in the bell jar 26, a protective film of ZnS is evaporated onto the contact and active areas for protection against atmospheric contamination. Typically, an evaporated layer of about 1 micron thick is applied. After the protective film step 68, gold leads are ball bonded, step 70, to the contact areas using a room temperature process.

Figure 5:
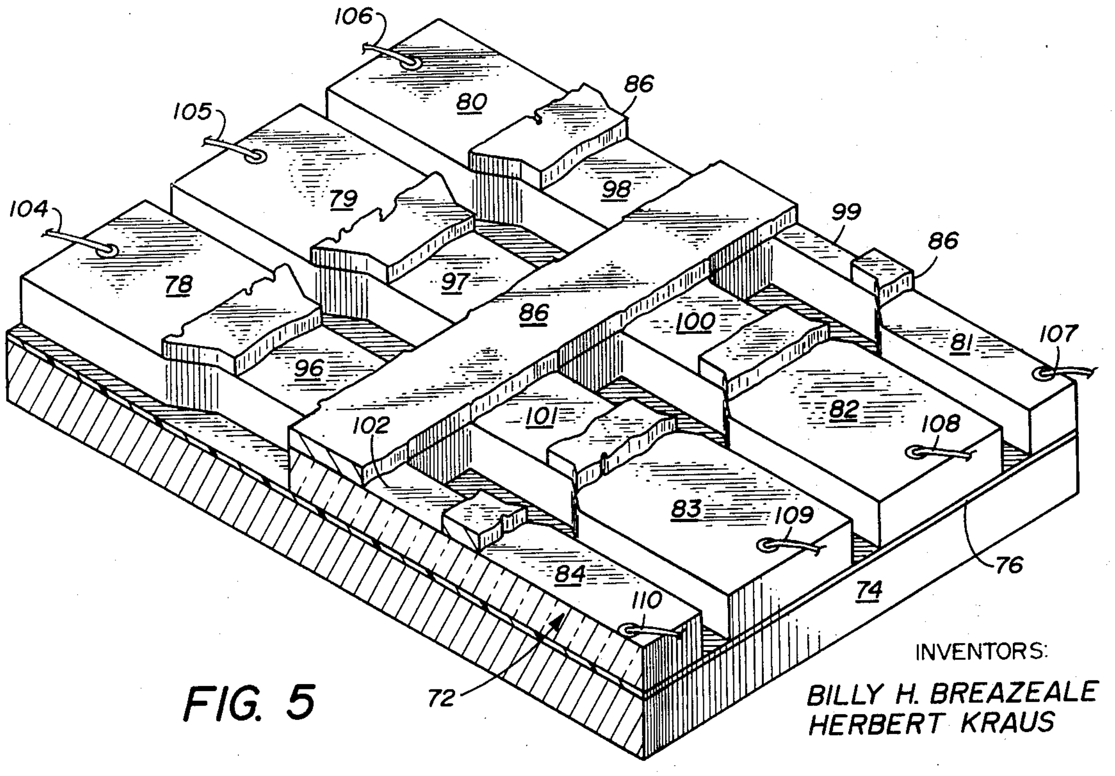
FIG. 5 is a pictorial cross section of a photodetector array fabricated by the process of FIG. 1.

Referring to FIG. 5, there is shown an array of (Hg,Cd)Te photodetectors fabricated by the processes described above. A wafer 72 of (Hg,Cd)Te is mounted to a polished sapphire substrate 74 by means of an epoxy cement 76. The wafer 72 was originally a solid slab with a polished surface which is cemented to the substrate 74.

After polishing the upper surface and removing the bromides of Cd and Te, the bromides of Hg are removed by the hydrogen peroxide rinse in the passivation step 12. After completing the process of FIG. 2, additional contaminants are removed by the hydrogen glow discharge process of FIG. 3. Indium is then evaporated onto the areas 78 to 84 of the wafer 72.

A photoresist mask 86, for example, a KTFR material, is applied over the wafer 72. This mask is fixed and patterned to define the upper surface pattern of the photodetector. The wafer 72 is then etched with a spray of from ½% to 3% bromine in methanol. The etch is carried out through the mask 86 down to the epoxy cement 76.

Next, the photoresist layer 86 is outlined to define the contact areas 78 through 84 and the active areas 96 through 102. At this time, the array is returned to the bell jar 26 and a second hydrogen glow discharge process removes surface contaminants from the contact areas 78 through 84 and the active areas 96 through 102. The ZnS protective film is then applied by evaporation to a thickness of about one micron. The final step in preparing the array of FIG. 5 is to ball bond the leads 104–110 to the contact areas 78 through 84.

Using the process of FIG. 1, an array of eleven photodetector elements was fabricated on a wafer and the resistance measured. An array of nine elements was fabricated on another wafer without the passivation step 12 and the contaminant removal steps 62 and 66. The resistance of these elements was also measured.

Figure 6:
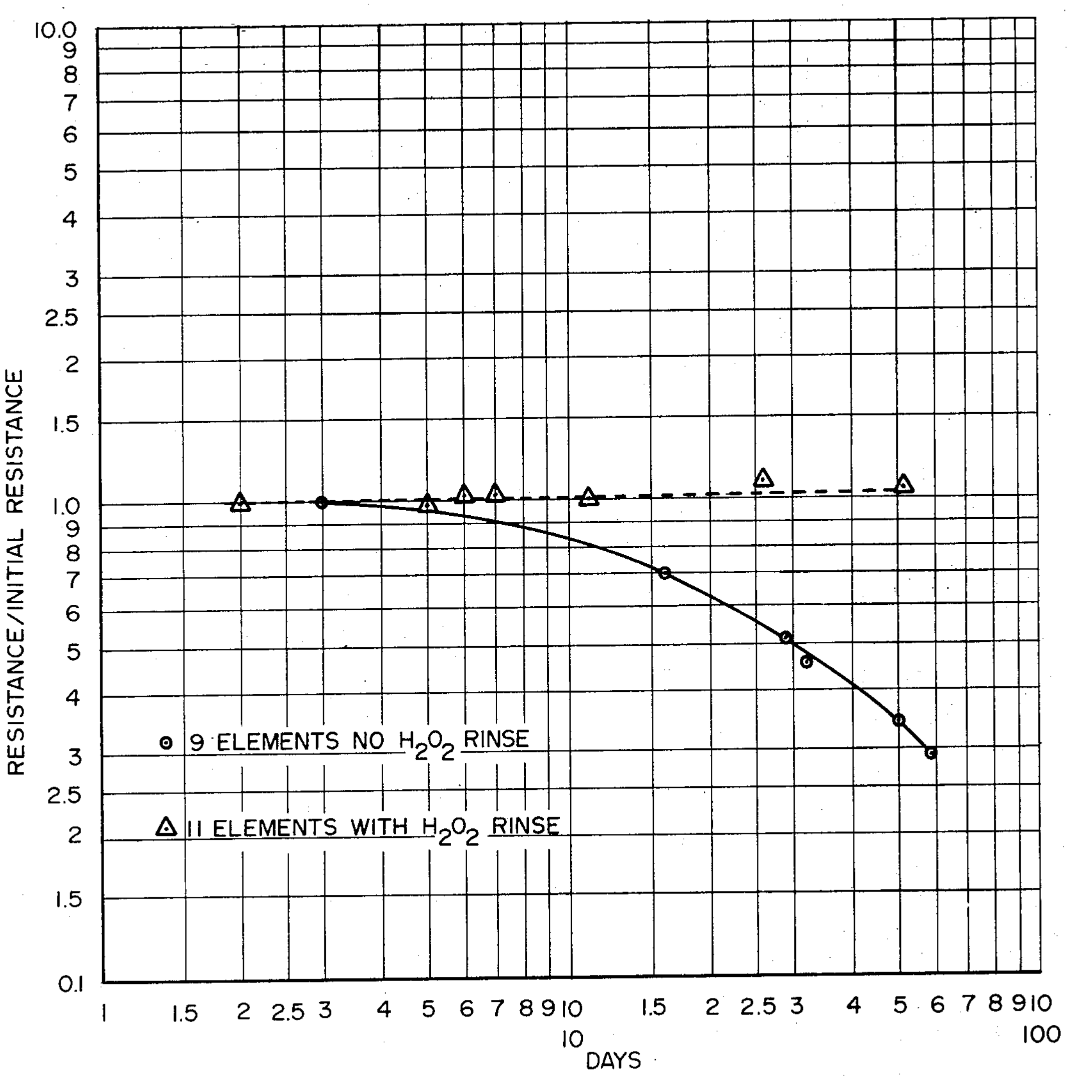
FIG. 6 is a plot of resistance/initial resistance versus time in days for a photodetector prepared by a process including surface passivation and for a photodetector prepared by a process that did not include surface passivation.

Referring to FIG. 6, there is shown a plot of percent resistance/initial resistance versus time for the elements prepared by the process of FIG. 1 and the elements prepared without passivation and contaminant removal. For the elements with the hydrogen peroxide rinse, the ratio of resistance to initial resistance remained essentially constant for the test period of 60 days. On the other hand, the ratio of resistance to the initial resistance for the elements without the hydrogen peroxide rinse decayed to about .3 during the 60-day test period. Further, experimental data has shown that photodetectors in which the bromides have been removed show improved characteristics. Also, these detectors have exhibited exceptionally high uniformity throughout the arrays.

While preferred embodiments of the invention have been described in detail herein, and shown in the accompanying drawings, it will be evident that various further modifications are possible.

What is claimed is:

1. A process for passivation of a (Hg,Cd)Te semiconductor surface polished with a solution of bromine in methanol comprising:
- treating the polished surface of a (Hg,Cd)Te semiconductor material with a hydrogen peroxide solution,
- rinsing the hydrogen peroxide treated surface with deionized water to remove contaminants including the halogen contaminants, and
- drying the semiconductor material in an atmosphere of nitrogen.

2. A process for passivation of said semiconductor surface as set forth in claim 1 including the step of rinsing the polished semiconductor surface with a methanol solution prior to the treatment with said hydrogen peroxide.

3. A process for passivation of said semiconductor surface as set forth in claim 2 including the step of rinsing the polished semiconductor surface with trichloroethylene solution prior to rinsing with said methanol solution.

4. A process for passivation of said semiconductor surface as set forth in claim 1 wherein said polished surface is treated with a warm 30% mixture of hydrogen peroxide.

5. A process of passivation of said semiconductor surface as set forth in claim 1 wherein said step of rinsing the surface with deionized water is repeated 3 times.

6. A method of surface preparation and passivation of a (Hg,Cd)Te semiconductor material, comprising:
- polishing the surface of said semiconductor material with bromine in methanol,
- rinsing the polished surface in a sequence by the order given with:
  - (a) a trichloroethylene solution,

- (b) a methanol solution,
  - (c) a hydrogen peroxide solution,
  - (d) deionized water, and
- drying said semiconductor material in an atmosphere of nitrogen.

7. A method of surface preparation and passivation as set forth in claim 6 wherein the polished surface is rinsed with a warm 30% mixture of hydrogen peroxide.

8. A method of surface preparation and passivation as set forth in claim 6 wherein the polished surface is rinsed with a 30% mixture of hydrogen peroxide at 90° C. for 30 seconds.

9. A method of fabricating a (Hg,Cd)Te detector, comprising:
- polishing the surface of a wafer of (Hg,Cd)Te with bromine in methanol,
- treating the polished surface of the (Hg,Cd)Te wafer with a hydrogen peroxide solution,
- rinsing the hydrogen peroxide treated surface with deionized water to remove contaminants including bromine,
- defining the active areas of the detector, and
- evaporating a zinc sulfide film over the active area to prevent further contamination thereof.

10. A method of fabricating a (Hg,Cd)Te detector as set forth in claim 9 including the steps of:
- defining contact areas for the detector prior to defining the active areas, and
- evaporating a contact material onto the defined contact areas.

11. A method of fabricating a (Hg,Cd)Te detector as set forth in claim 10 including the step of rinsing the polished (Hg,Cd)Te surface with a methanol solution prior to treatment with the hydrogen peroxide solution.

12. A method of fabricating a (Hg,Cd)Te detector as set forth in claim 11 including the step of rinsing the polished wafer surface with trichloroethylene prior to rinsing with the methanol solution.

13. A method of fabricating a (Hg,Cd)Te detector as set forth in claim 12 wherein the polished surface is treated with a warm 30% mixture of hydrogen peroxide.

14. A method of fabricating a (Hg,Cd)Te detector as set forth in claim 13 wherein the step of rinsing the hydrogen peroxide treated surface with deionized water is repeated 3 times.

15. A method of fabricating (Hg,Cd)Te detector, comprising:
- (a) polishing the surface of a wafer (Hg,Cd)Te with bromine in methanol,
- (b) treating the polished surface of (Hg,Cd)Te wafer with a hydrogen peroxide solution, and
- (c) rinsing the hydrogen peroxide treated surface with deionized water to remove contaminants including bromine.

References Cited

UNITED STATES PATENTS

| | | | |
|---|---|---|---|
| 3,205,555 | 9/1955 | Balde et al. | 156—17 X |
| 3,342,652 | 9/1967 | Reisman et al. | 156—17 |
| 3,156,596 | 11/1964 | Sullivan | 156—17 |

ALFRED L. LEAVITT, Primary Examiner

M. F. ESPOSITO, Assistant Examiner

U.S. Cl. X.R.

117—106 R, 213, 217; 156—17; 134—26; 29—589